(12) United States Patent
Park et al.

(10) Patent No.: US 10,923,389 B2
(45) Date of Patent: Feb. 16, 2021

(54) AIR-GAP SPACERS FOR FIELD-EFFECT TRANSISTORS

(71) Applicant: GLOBALFOUNDRIES U.S. Inc., Grand Cayman (KY)

(72) Inventors: Chanro Park, Clifton Park, NY (US); Min Gyu Sung, Latham, NY (US); Hoon Kim, Clifton Park, NY (US); Ruilong Xie, Niskayuna, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/288,780

(22) Filed: Feb. 28, 2019

(65) Prior Publication Data

US 2019/0198381 A1 Jun. 27, 2019

Related U.S. Application Data

(62) Division of application No. 15/376,831, filed on Dec. 13, 2016, now Pat. No. 10,319,627.

(51) Int. Cl.
| | |
|---|---|
| *H01L 29/78* | (2006.01) |
| *H01L 21/768* | (2006.01) |
| *H01L 29/66* | (2006.01) |
| *H01L 29/06* | (2006.01) |
| *H01L 29/49* | (2006.01) |

(52) U.S. Cl.
CPC ...... *H01L 21/7682* (2013.01); *H01L 29/0653* (2013.01); *H01L 29/4991* (2013.01); *H01L 29/6653* (2013.01); *H01L 29/66545* (2013.01); *H01L 29/66795* (2013.01); *H01L 29/7851* (2013.01); *H01L 29/7856* (2013.01)

(58) Field of Classification Search
CPC .......... H01L 21/7682; H01L 29/66795; H01L 29/66545; H01L 29/6653; H01L 27/0886; H01L 21/823468; H01L 21/823431; H01L 29/7856; H01L 29/7851; H01L 29/4991; H01L 29/0653
See application file for complete search history.

(56) References Cited

U.S. PATENT DOCUMENTS

| | | |
|---|---|---|
| 5,869,374 A | 2/1999 | Wu |
| 6,127,451 A | 10/2000 | Qian |
| 6,316,347 B1 | 11/2001 | Chang et al. |

(Continued)

*Primary Examiner* — Charles D Garber
*Assistant Examiner* — S M Sohel Imtiaz
(74) *Attorney, Agent, or Firm* — Thompson Hine LLP; Francois Pagette

(57) ABSTRACT

Structures for air-gap spacers in a field-effect transistor and methods for forming air-gap spacers in a field-effect transistor. A gate structure is formed on a top surface of a semiconductor body. A dielectric spacer is formed adjacent to a vertical sidewall of the gate structure. A semiconductor layer is formed on the top surface of the semiconductor body. The semiconductor layer is arranged relative to the vertical sidewall of the gate structure such that a first section of the first dielectric spacer is located in a space between the semiconductor layer and the vertical sidewall of the gate structure. A second section of the dielectric spacer that is located above a top surface of the semiconductor layer is removed. An air-gap spacer is formed in a space from which the second section of the dielectric spacer is removed.

20 Claims, 6 Drawing Sheets

(56) References Cited

U.S. PATENT DOCUMENTS

| | | |
|---|---|---|
| 6,635,967 B2 | 10/2003 | Chang et al. |
| 7,741,663 B2 | 6/2010 | Hause et al. |
| 9,362,355 B1 * | 6/2016 | Cheng ............... H01L 29/78696 |
| 9,608,065 B1 * | 3/2017 | Bergendahl ......... H01L 27/0886 |
| 9,627,514 B1 * | 4/2017 | Kim ................... H01L 29/6653 |
| 9,716,154 B2 * | 7/2017 | Chang ................ H01L 21/7682 |
| 9,716,158 B1 * | 7/2017 | Cheng ............... H01L 29/0847 |
| 9,941,378 B2 * | 4/2018 | Basker ................ C23C 14/0652 |
| 10,164,029 B2 * | 12/2018 | Chang ............... H01L 21/76897 |
| 10,204,999 B2 | 2/2019 | Lee et al. |
| 2006/0110884 A1 | 5/2006 | Wang et al. |
| 2013/0093019 A1 | 4/2013 | Ando et al. |
| 2013/0320550 A1 * | 12/2013 | Kim ................. H01L 21/76897 |
| | | 257/773 |
| 2014/0061734 A1 * | 3/2014 | Basker .............. H01L 29/66795 |
| | | 257/288 |
| 2014/0103450 A1 * | 4/2014 | Cheng ................ H01L 29/0653 |
| | | 257/401 |
| 2014/0117420 A1 * | 5/2014 | Chen ..................... H01L 23/485 |
| | | 257/288 |
| 2014/0264479 A1 | 9/2014 | Cai et al. |
| 2015/0255571 A1 * | 9/2015 | Xu .................... H01L 29/66545 |
| | | 257/288 |
| 2016/0268158 A1 * | 9/2016 | Leobandung ......... H01L 23/535 |
| 2016/0307773 A1 * | 10/2016 | Lee ................... H01L 27/10823 |
| 2017/0162650 A1 * | 6/2017 | Cheng .............. H01L 29/66795 |
| 2017/0250281 A1 * | 8/2017 | Tsai ................ H01L 21/823468 |
| 2018/0047615 A1 * | 2/2018 | Cheng ............... H01L 29/66795 |

* cited by examiner

AIR-GAP SPACERS FOR FIELD-EFFECT TRANSISTORS

BACKGROUND

The present invention relates to semiconductor device fabrication and integrated circuits and, more specifically, to structures for a field-effect transistor that include an air-gap spacer and methods for forming a field-effect transistor with an air-gap spacer.

Device structures for a field-effect transistor include a source, a drain, a channel situated between the source and drain, and a gate structure including a gate electrode and a gate dielectric separating the gate electrode from the channel. A gate voltage applied to the gate electrode is used to provide switching that selectively connects the source and drain to each another through the channel. The channel of a metal-oxide-semiconductor field-effect transistor (MOSFET) is located beneath the top surface of the substrate on which the gate structure is supported.

A fin-type field-effect transistor (FinFET) is a type of MOSFET that is capable of being more densely packed in an integrated circuit than planar field-effect transistors. A FinFET may include a semiconductor fin, a gate electrode that overlaps a channel in the semiconductor fin, and heavily-doped source/drain regions formed in sections of the semiconductor fin peripheral to the gate structure. The channel of a FinFET is effectively elevated above the top surface of the substrate so that the gate structure can wrap about multiple sides of the channel. The wrapped-arrangement between the gate electrode and fin improves control of the channel and reduces the leakage current when the FinFET is in its 'off' state. This, in turn, enables the use of lower threshold voltages and results in better performance and power.

Air-gap spacers may be formed adjacent to the sidewalls of the gate electrode of a field-effect transistor in order to reduce the gate-source capacitance, which may lead to a performance boost. The formation of an air-gap spacer may require removal of a dummy spacer material with an etching process. The etch depth may be difficult to control during the performance of the etching process used to remove the dummy spacer material. If the etch depth is too great, then the gate dielectric material may be exposed by the air-gap spacer. If the etch depth is too shallow, then the boost in performance may not be optimized by the formation of the air-gap spacer.

Improved structures for a field-effect transistor and methods for forming a field-effect transistor are needed.

SUMMARY

In an embodiment of the invention, a method includes forming a gate structure on a top surface of a semiconductor body, forming a dielectric spacer adjacent to a vertical sidewall of the gate structure, and forming a semiconductor layer on the top surface of the semiconductor body. The semiconductor layer is arranged relative to the vertical sidewall of the gate structure such that a first section of the dielectric spacer is located horizontally between the semiconductor layer and the vertical sidewall of the gate structure. The method further includes removing a second section of the dielectric spacer that is located above a top surface of the semiconductor layer, and forming an air-gap spacer in a space from which the second section of the dielectric spacer is removed.

In an embodiment of the invention, a structure includes a semiconductor body having a top surface, a gate electrode on the top surface of the semiconductor body, and a semiconductor layer on the top surface of the semiconductor body. The gate electrode has a vertical sidewall, and the semiconductor layer has a top surface. The structure further includes a dielectric spacer between the semiconductor layer and the vertical sidewall of the gate electrode. The dielectric spacer extends from the top surface of the semiconductor body to the top surface of the semiconductor layer. A contact is connected with the top surface of the semiconductor layer. An air-gap spacer is located horizontally between the contact and the vertical sidewall of the gate electrode. The air-gap spacer extends vertically to the top surface of the semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
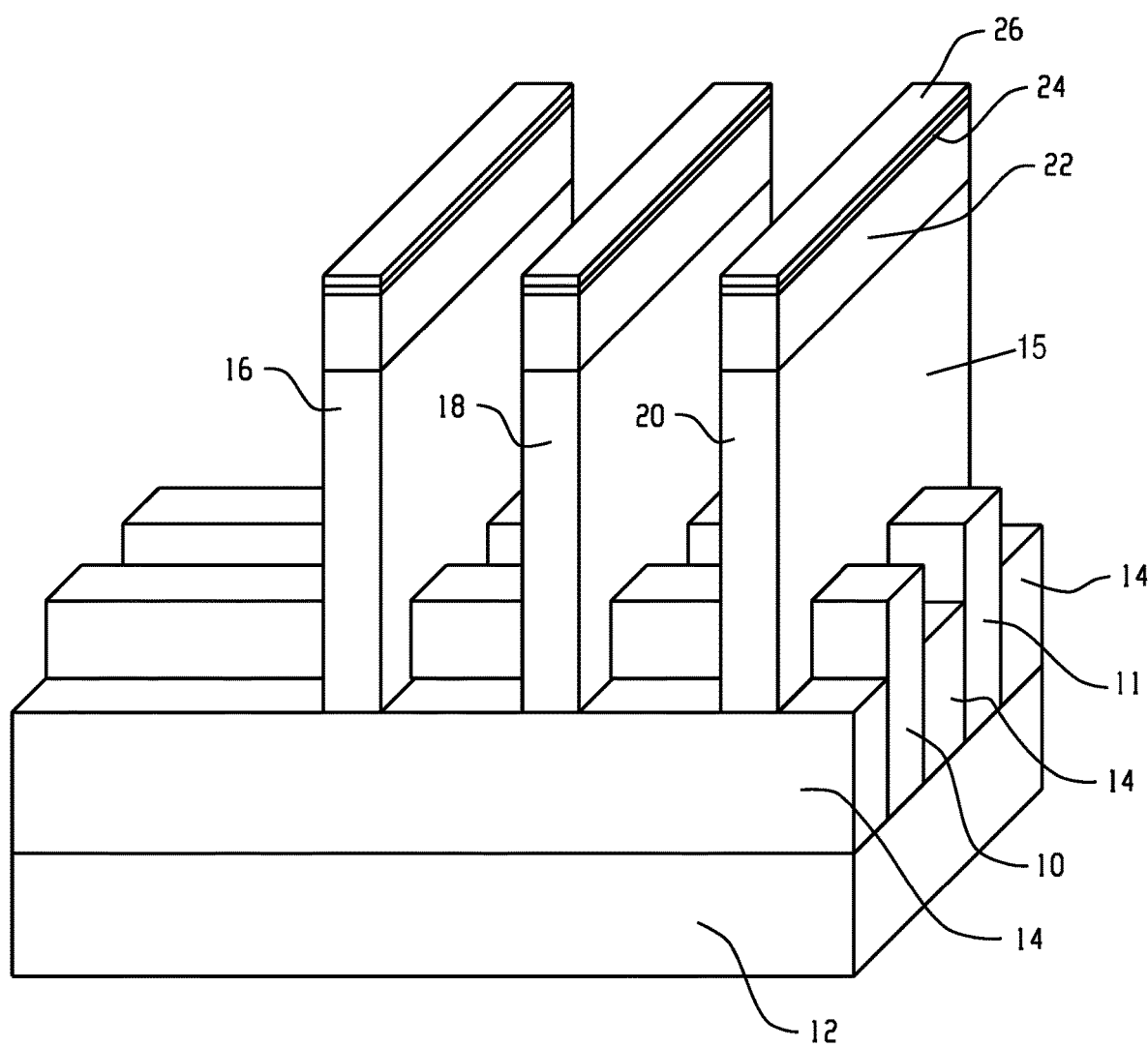
FIG. 1 is a perspective view of a portion of a substrate at an initial stage of a processing method in accordance with embodiments of the invention.
Figure 2:
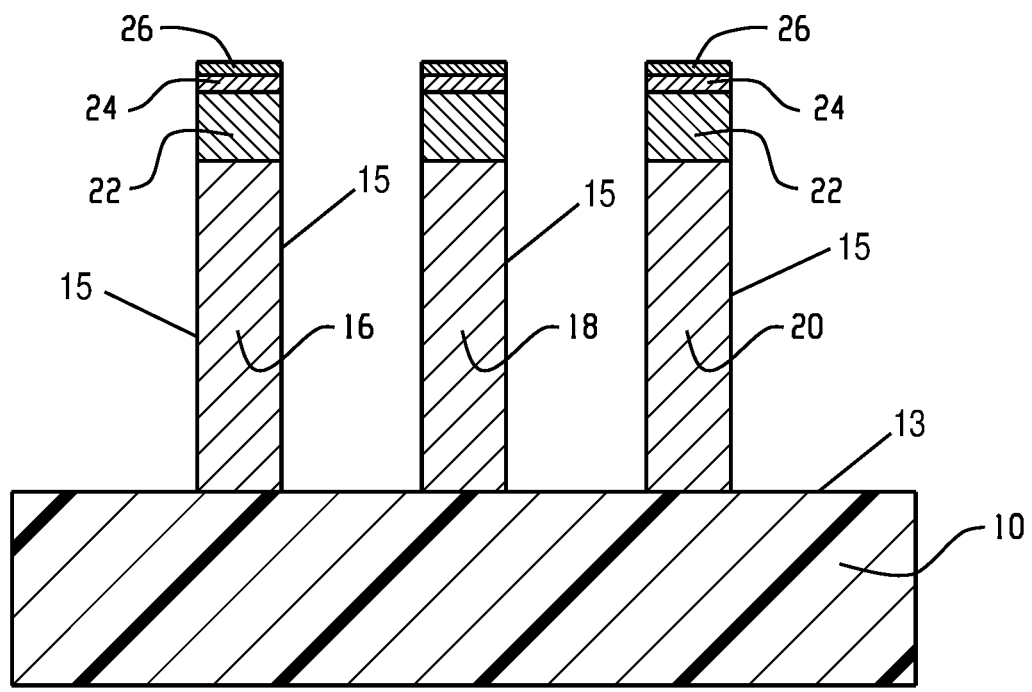
FIG. 2 is a cross-sectional view taken generally along the length of one of the fins in FIG. 1.

With reference to FIGS. 1, 2 and in accordance with embodiments of the invention, fins 10, 11 are formed and trench isolation 14 is formed that electrically isolates fin 10 from fin 11 and fins 10, 11 from other nearby fins (not shown). The fins 10, 11 are semiconductor bodies that may be formed from the semiconductor material of the substrate 12 by photolithography and etching processes, such as a sidewall imaging transfer (SIT) process. The substrate 12 may be a bulk substrate composed of silicon or a silicon device layer of a semiconductor-on-insulator (SOI) substrate. The trench isolation 14 may be composed of, for example, silicon dioxide ($SiO_2$) deposited by chemical vapor deposition (CVD). Independent of their method of formation, the top surfaces 13 of the fins 10, 11 may generally be considered to be an extension of the top surface of the substrate 12.

A plurality of sacrificial gate structures 16, 18, 20 project vertically from a plane at the top surface 13 of the fin 10 and overlap with the fin 10. A similar spatial relationship may exist between the sacrificial gate structures 16, 18, 20 and the fin 11. The sacrificial gate structures 16, 18, 20, which may be composed of a semiconductor material such as polysilicon, are capped at their respective top surfaces by a plurality of hardmask layers 22, 24, 26. The sacrificial gate structures 16, 18, 20 and the sections of the hardmask layers 22, 24, 26 respectively capping the sacrificial gate structures 16, 18, 20 may be formed by depositing a layer stack of their constituent materials and etching in the presence of a patterned etch mask (not shown) with the sections of the hardmask layers 22, 24, 26 operating as a hardmask to pattern the sacrificial gate structures 16, 18, 20.

The hardmask layers 22 and 26 are each composed of a dielectric material chosen to be removed selective to the dielectric material constituting the hardmask layer 24. Hardmask layer 22 and hardmask layer 26 may be composed of a thin layer of silicon nitride ($Si_3N_4$). Hardmask layer 24 may be composed of a thin layer of silicon dioxide ($SiO_2$), which exhibits etch selectivity relative to silicon nitride.

Figure 3:
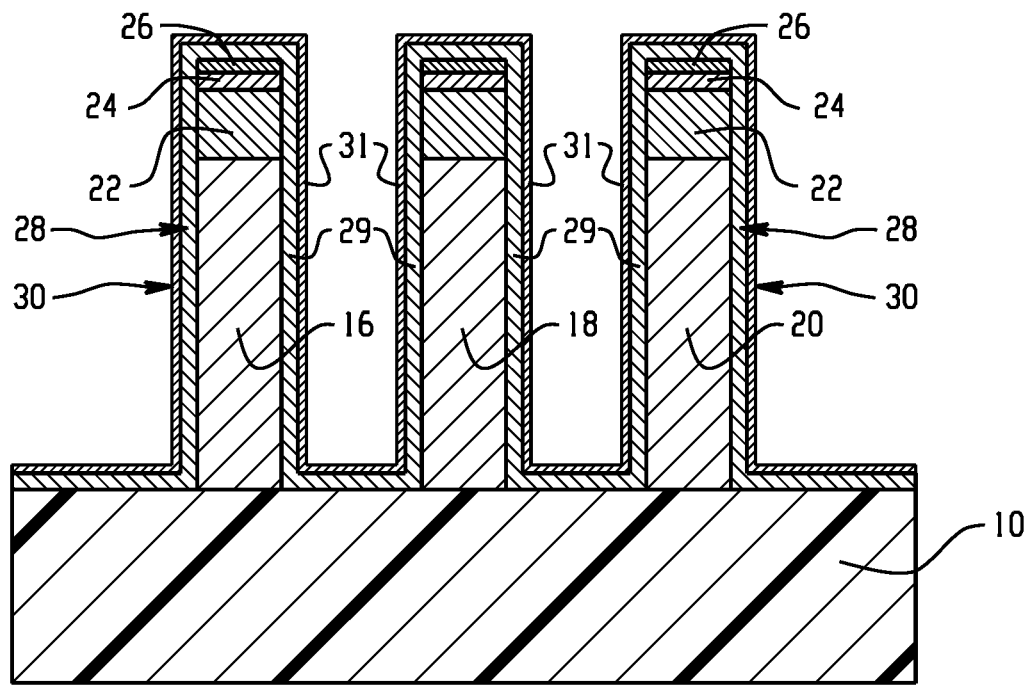
FIGS. 3-11 are cross-sectional views of the substrate portion at successive stages of the processing method subsequent to the fabrication stage of FIG. 2.

With reference to FIG. 3 in which like reference numerals refer to like features in FIGS. 1, 2 and at a subsequent fabrication stage, conformal layers 28, 30 are serially deposited that cover the vertical sidewalls 15 of the sacrificial gate structures 16, 18, 20, the top surfaces of the sacrificial gate structures 16, 18, 20, and the top surface 13 of the fin 10 in the gaps between adjacent pairs of the sacrificial gate structures 16, 18, 20. The conformal layer 28 includes sections defining dielectric spacers 29 that are located adjacent to and/or on the vertical sidewalls 15 of the sacrificial gate structures 16, 18, 20. The conformal layer 30 also includes sections defining dielectric spacers 31 formed adjacent to the vertical sidewalls 15 of the sacrificial gate structures 16, 18, 20, and separated from the vertical sidewalls 15 of the sacrificial gate structures 16, 18, 20 by the dielectric spacers 29. The spacers 29, 31 are shaped from the conformal layers 28, 30 in a subsequent fabrication stage.

The outer conformal layer 30 covers the inner conformal layer 28, which is located between the outer conformal layer 30 and the vertical sidewalls 15 of the sacrificial gate structures 16, 18, 20. The inner conformal layer 28, which is deposited before the outer conformal layer 30, may be composed of a thin layer of silicon dioxide ($SiO_2$). The outer conformal layer 30, which is deposited after the inner conformal layer 28, may be composed of a thin layer of silicon nitride ($Si_3N_4$) that exhibits etch selectivity relative to silicon dioxide. The thickness of the inner conformal layer 28 may be greater than the thickness of the outer conformal layer 30.

Figure 4:
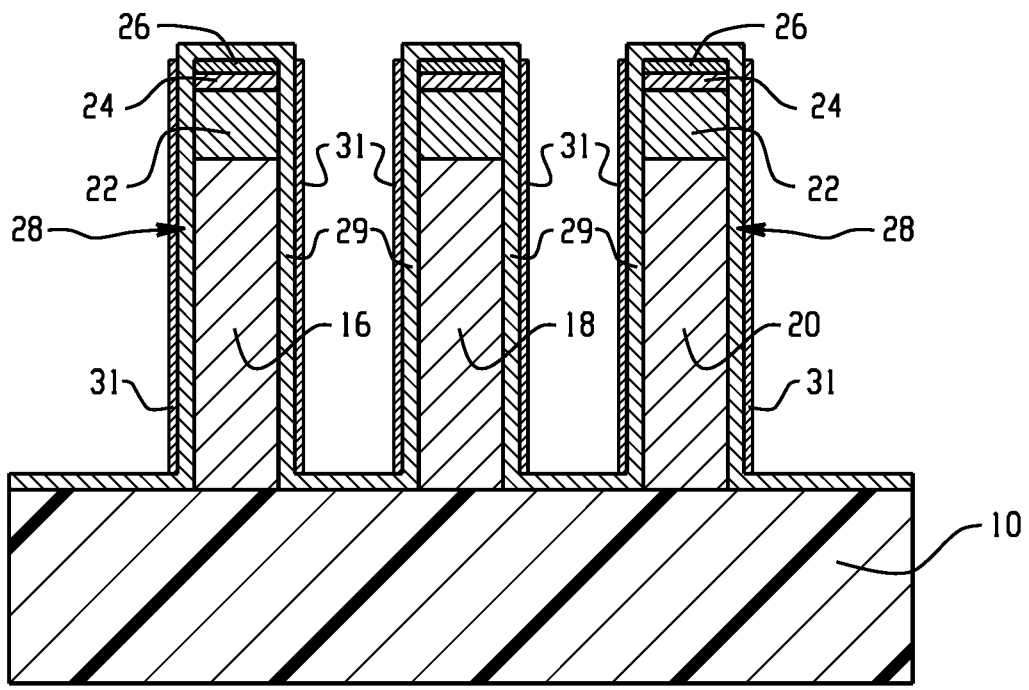

With reference to FIG. 4 in which like reference numerals refer to like features in FIG. 3 and at a subsequent fabrication stage, the spacers 31 are formed by shaping the outer conformal layer 30 with an anisotropic etching process, such as reactive ion etching (ME), that preferentially removes the dielectric material of conformal layer 30 from horizontal surfaces, such as the top surfaces of the conformal layer 28 in the gaps between the vertical sidewalls 15 of the sacrificial gate structures 16, 18, 20. The inner conformal layer 28 protects the sections of the hardmask layers 22, 24, 26 capping each of the sacrificial gate structures 16, 18, 20 against removal during this etch-back process.

Figure 5:
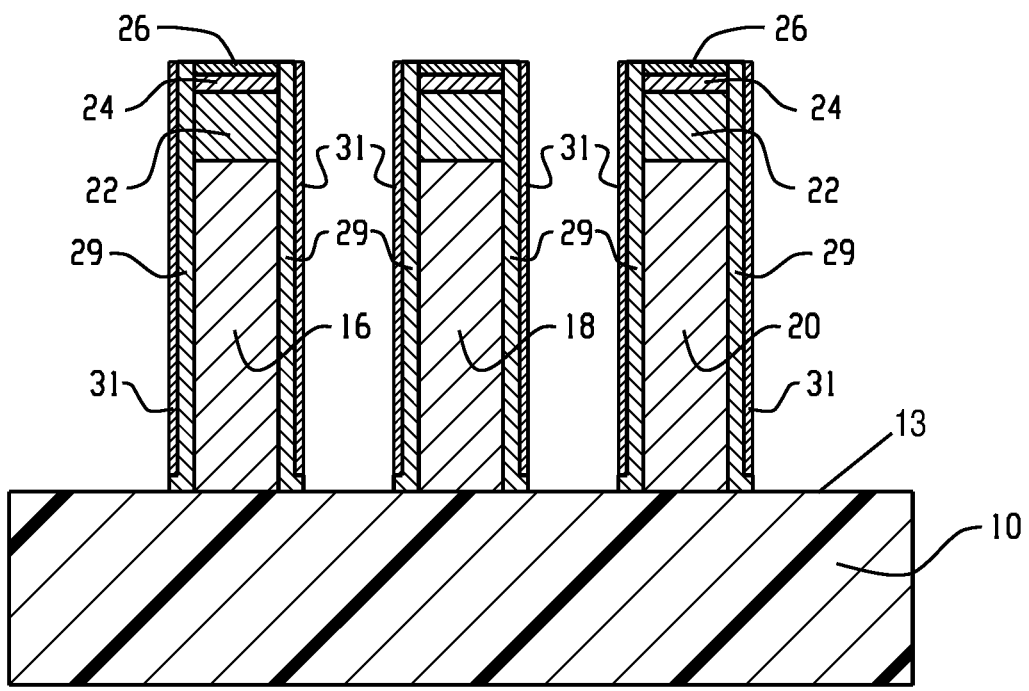

With reference to FIG. 5 in which like reference numerals refer to like features in FIG. 4 and at a subsequent fabrication stage, the spacers 29 are formed by shaping the inner conformal layer 28 with an anisotropic etching process, such as reactive ion etching (ME), that removes the dielectric material of conformal layer 28 from horizontal surfaces, such as the top surface of the fin 10 in the gaps between the vertical sidewalls 15 of the sacrificial gate structures 16, 18, 20. The etching process preferentially removes the sections of the conformal layer 28 selective to the dielectric material constituting the dielectric spacers 31 and selective to the semiconductor material constituting the fin 10. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The thickness of the inner dielectric spacers 29 may be greater than the thickness of the outer dielectric spacers 31, which reflects the relationship between the thicknesses of the conformal layers 28, 30 that are shaped to respectively form the dielectric spacers 29, 31. The spacers 29, 31 may have the same height relative to the top surface 13 of the fin 10, and extend vertically from the top surface 13 of the fin 10 past the top surfaces of the sacrificial gate structures 16, 18, 20 to the level of hardmask layer 26.

Figure 6:
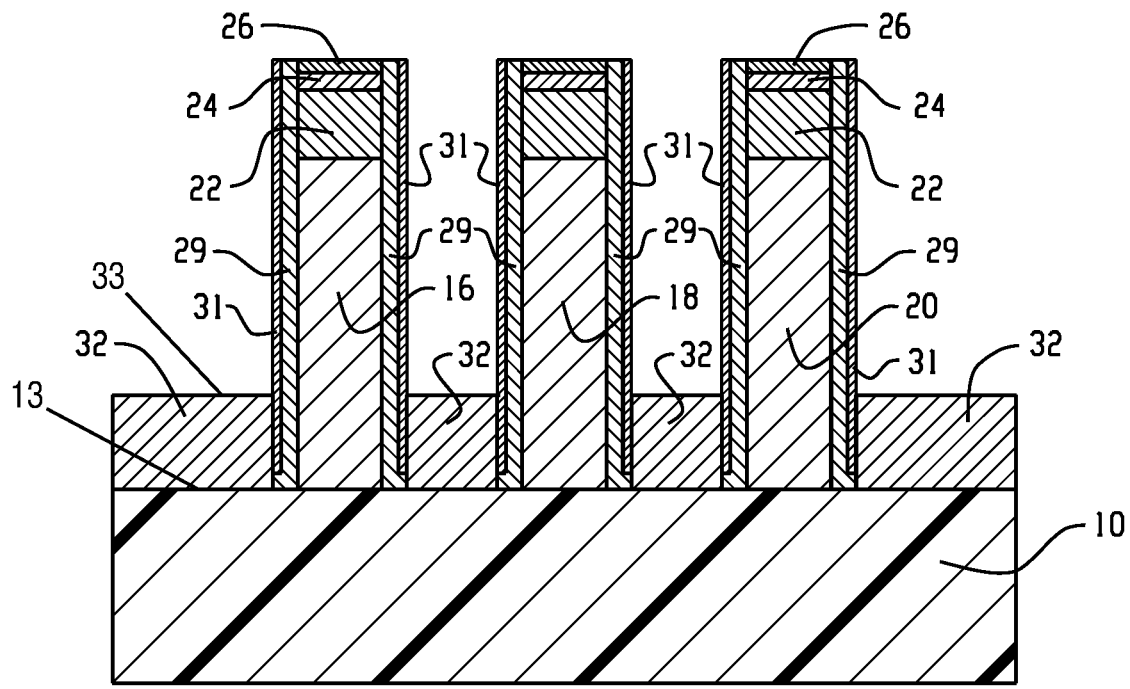

With reference to FIG. 6 in which like reference numerals refer to like features in FIG. 5 and at a subsequent fabrication stage, a semiconductor layer 32 is formed on the fin 10 in the gaps (i.e., open spaces) between the spacer-clad sacrificial gate structures 16, 18, 20. The semiconductor layer 32 may be used, for example, to merge the source/drain regions of the fin 10 with the source/drain regions of adjacent fins, such as fin 11 (FIG. 1). The semiconductor layer 32, which is located on the top surface 13 of the fin 10, may be comprised of an epitaxial semiconductor material, such as silicon germanium (SiGe) or silicon (Si), and may be in situ doped during growth to impart a given conductivity type to the grown semiconductor material. The semiconductor layer 32 may be formed using an epitaxial growth process, such as a selective epitaxial growth process in which the constituent semiconductor material nucleates for epitaxial growth on semiconductor surfaces (e.g., the top surface of the fin 10), but does not nucleate for epitaxial growth on insulator surfaces (e.g., the hardmask layer 26 and the dielectric spacers 31).

The semiconductor layer 32 has a top surface 33 with a given height relative to the top surface 13 of the fin 10 that is determined by its layer thickness. Control over the layer thickness may be exercised through control over the deposition conditions. The outer dielectric spacers 31 cover and protect the inner dielectric spacers 29 during a pre-clean prior to the epitaxial growth of the semiconductor layer 32. For example, the pre-clean may remove native oxide from the surfaces of the fin 10, which could also erode the material of the inner dielectric spacers 29 if comprised of silicon dioxide and not masked by the outer dielectric spacers 31.

Figure 7:
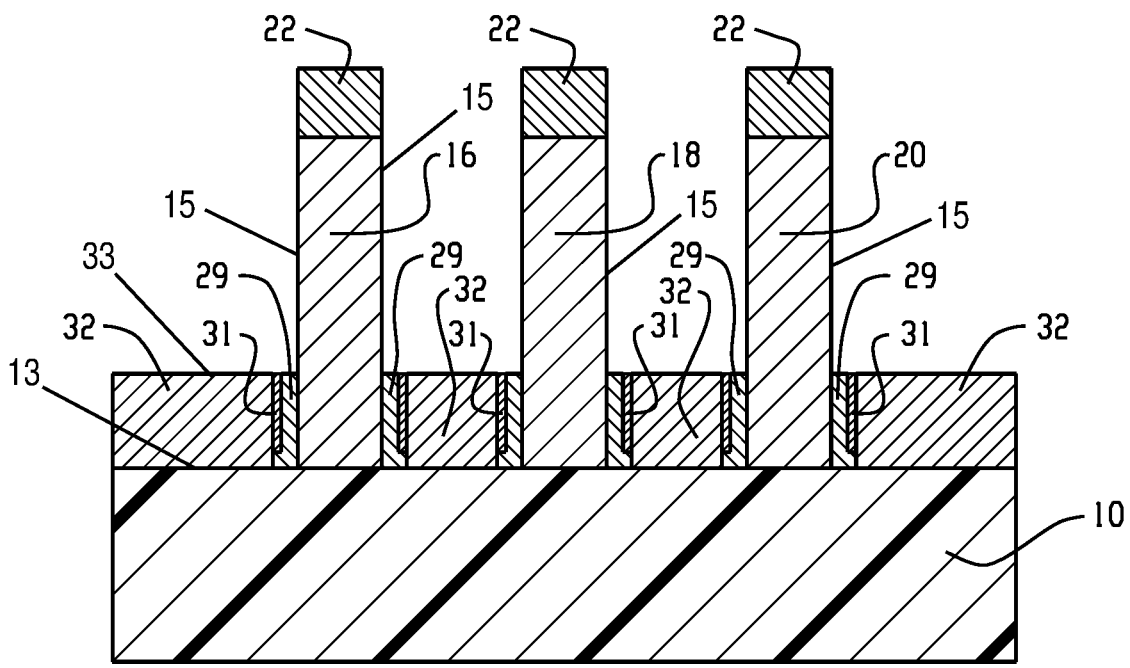

With reference to FIG. 7 in which like reference numerals refer to like features in FIG. 6 and at a subsequent fabrication stage, sections of the outer dielectric spacers 31 are removed from a portion of the vertical sidewalls 15 of the sacrificial gate structures 16, 18, 20 that is located above the top surface 33 of the semiconductor layer 32. These sections of the outer dielectric spacers 31 may be removed by an etching process, such as a wet chemical etch. The hardmask layer 26 is also removed by the etching process from the top surfaces of the sacrificial gate structures 16, 18, 20. The removal of the outer dielectric spacers 31 and the hardmask layer 26 is selective to the materials constituting the inner dielectric spacers 29 and the hardmask layer 24.

Sections of the outer dielectric spacers 31 are retained in each of the spaces vertically below the top surface 33 of the semiconductor layer 32 and horizontally between the semiconductor layer 32 and the vertical sidewall 15 of the adjacent one of the sacrificial gate structures 16, 18, 20. These sections of the outer dielectric spacers 31 extend vertically from the top surface 13 of the fin 10 to the top surface 33 of the semiconductor layer 32.

After the outer dielectric spacers 31 are removed to the top surface 33 of the semiconductor layer 32, the inner dielectric spacers 29 are removed from a portion of the vertical sidewalls 15 of the sacrificial gate structures 16, 18, 20 above the top surface 33 of the semiconductor layer 32. These sections of the inner dielectric spacers 29 may be removed by an etching process, such as a wet chemical etch. The hardmask layer 24 is also removed by the etching process from the top surfaces of the sacrificial gate structures 16, 18, 20. The removal of the inner dielectric spacers 29 and the hardmask layer 24 is selective to the materials constituting the fin 10, the sacrificial gate structures 16, 18, 20, the hardmask layer 22, and the retained sections of the outer dielectric spacers 31.

After the sequence of etching processes, respective sections of the dielectric spacers 29, 31 are retained between the vertical sidewalls 15 of each adjacent pair of the sacrificial gate structures 16, 18, 20. Sections of the inner dielectric spacers 29 are retained in the space vertically below the top surface 33 of the semiconductor layer 32, and horizontally between the sacrificial gate structures 16, 18, 20 and the outer dielectric spacers 31. These retained sections of the inner dielectric spacers 29 extend vertically from the top surface 13 of the fin 10 to the top surface 33 of the semiconductor layer 32. The retained sections of the dielectric spacers 29, 31 are located near the interface of contact between the sacrificial gate structures 16, 18, 20 and the top surface 13 of the fin 10, and at and below the top surface 33 of the semiconductor layer 32. Sections of both of the dielectric spacers 29, 31 are removed from the majority of the vertical sidewalls 15 of the sacrificial gate structures 16, 18, 20 such that portions of the vertical sidewalls 15 of the sacrificial gate structures 16, 18, 20 are exposed and bare above the top surface 33 of the semiconductor layer 32.

Figure 8:
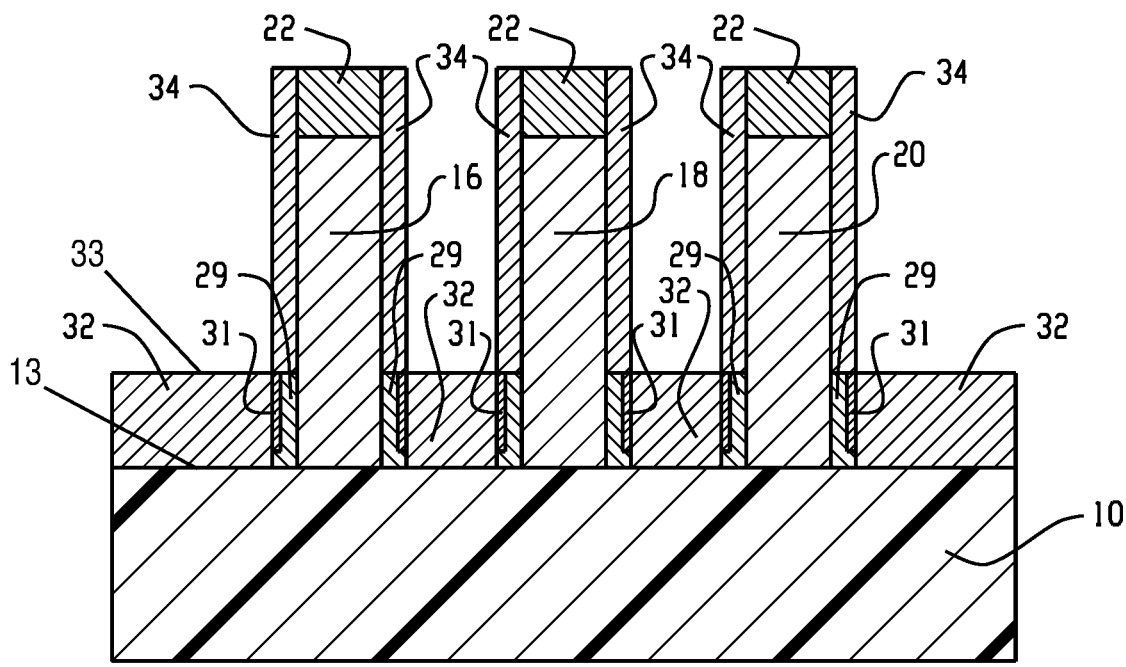

With reference to FIG. 8 in which like reference numerals refer to like features in FIG. 7 and at a subsequent fabrication stage, sidewall spacers 34 are formed on the exposed portions of the vertical sidewalls 15 of the sacrificial gate structures 16, 18, 20 and the respective capping sections of hardmask layer 22 above the level of the top surface 33 of the semiconductor layer 32. The sidewall spacers 34 may be formed by depositing a conformal layer comprised of a dielectric material, such as silicon nitride ($Si_3N_4$) deposited by atomic layer deposition (ALD), and shaping the conformal layer with an anisotropic etching process, such as RIE, that preferentially removes the dielectric material from horizontal surfaces, such as the top surface of the semiconductor layer 32. The material constituting the sidewall spacers 34 may be chosen such that the sacrificial gate structures 16, 18, 20 can be selectively removed relative to the sidewall spacers 34.

The sidewall spacers 34, the hardmask layer 22, and the outer dielectric spacers 31 may be composed of the same dielectric material, and that shared composition may be selected such that the shared constituent dielectric material may be removed selective to the dielectric material of the inner dielectric spacers 29. The sidewall spacers 34 may be thicker than the outer dielectric spacers 31. In an embodiment, the thickness of the sidewall spacers 34 may be greater than or equal to the summed thicknesses of the dielectric spacers 29 formed from the conformal layer 28 and the dielectric spacers 31 formed from the conformal layer 30.

Figure 9:
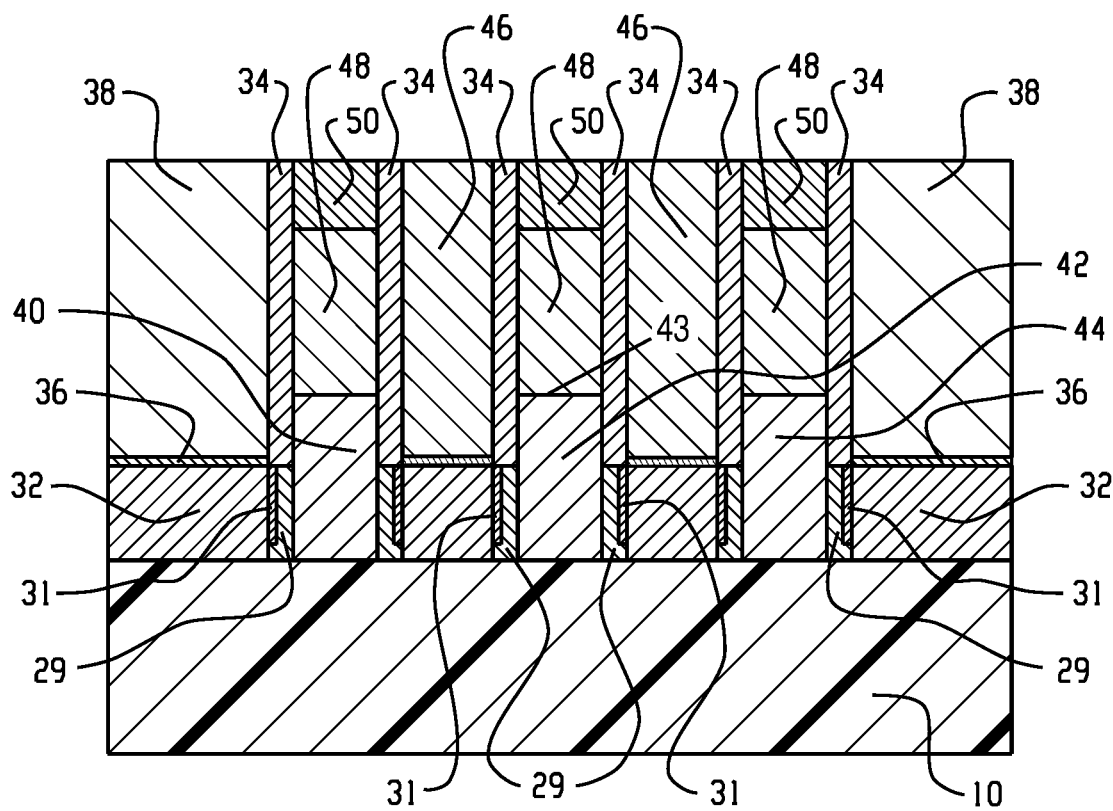

With reference to FIG. 9 in which like reference numerals refer to like features in FIG. 8 and at a subsequent fabrication stage, a liner layer 36 is deposited that covers the vertical sidewalls 15 of the sacrificial gate structures 16, 18, 20, the hardmask layer 22 on the top surfaces of the sacrificial gate structures 16, 18, 20, and the top surface 33 of the semiconductor layer 32 in the gaps between adjacent pairs of the sacrificial gate structures 16, 18, 20. The liner layer 36 may be composed of a dielectric material, such as silicon nitride ($Si_3N_4$) deposited by ALD.

An interlayer dielectric layer 38 is deposited, and may be comprised of silicon dioxide ($SiO_2$) deposited by CVD. An etching process is then performed to remove the sacrificial gate structures 16, 18, 20 selective to the interlayer dielectric layer 38 to thereby define gate cavities in which replacement gate electrodes will subsequently be formed. The etching process removes the material constituting the sacrificial gate structures 16, 18, 20 selective to the materials of the sidewall spacers 34, the interlayer dielectric layer 38, and the fin 10. Replacement gate electrodes 40, 42, 44 are formed in the gate cavities vacated by the sacrificial gate structures 16, 18, 20. The gate electrodes 40, 42, 44 may be comprised of a metal, such as aluminum or tungsten, and one or more work function metal layers present to adjust the threshold voltage. A gate dielectric (not shown) may be formed in the gate cavities on the top surface of the fin 10. The gate dielectric be comprised of a dielectric material, such as a high-k gate dielectric material like hafnium oxide.

Contacts 46 are formed in vertical contact openings in the interlayer dielectric layer 38 to contact the semiconductor layer 32 of the source/drain regions. Contacts 48 are also formed in vertical contact openings in the interlayer dielectric layer 38 to contact the gate electrodes of the gate electrodes 40, 42, 44. The contacts 46, 48 may be comprised of, for example, tungsten (W). Caps 50 comprised of a dielectric material cover the respective top surfaces of the gate electrodes 40, 42, 44. The caps 50 may be comprised of a dielectric material, such as silicon nitride ($Si_3N_4$), and may be constituted by the same dielectric material as the dielectric material constituting the sidewall spacers 34.

Figure 10:
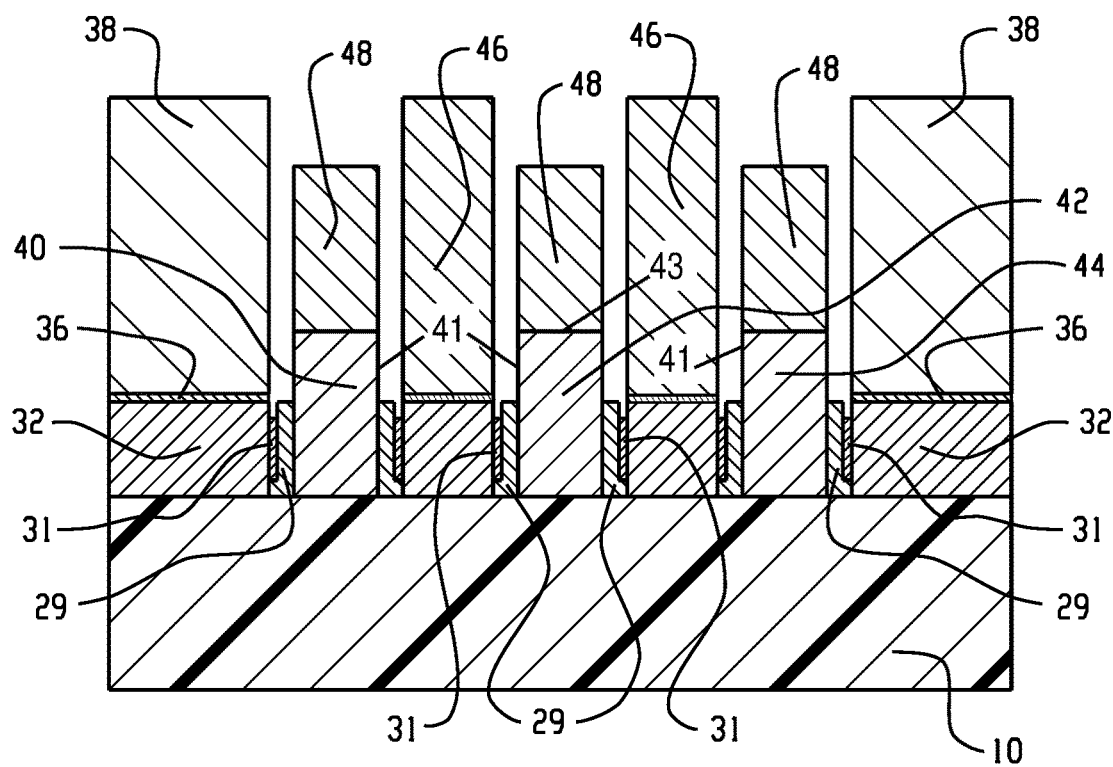

With reference to FIG. 10 in which like reference numerals refer to like features in FIG. 9 and at a subsequent fabrication stage, the sidewall spacers 34 and the caps 50 are removed selective to gate electrodes 40, 42, 44, the contacts 46, 48, the inner dielectric spacers 29, and the interlayer dielectric layer 38 by, for example, a wet chemical etch. The outer dielectric spacers 31 may be slightly recessed by the etching process removing the sidewall spacers 34 and the caps 50. However, the small width of the outer dielectric spacers 31 relative to the width of the sidewall spacers 34 and the placement between the semiconductor layer 32 and dielectric spacers 29 operates to limit the extent to which the dielectric spacers 31 are removed and recessed. The etched depth stops automatically at the top surface of the spacers 29, which is coplanar with the top surface 33 of the semiconductor layer 32. The precision of this control over the etched depth lends certainty and reproducibility as to the lower boundary for the subsequently-formed air-gap spacers. The spacer 29 extends from the top surface 13 of the fin 10 to the top surface 33 of the semiconductor layer 32.

Figure 11:
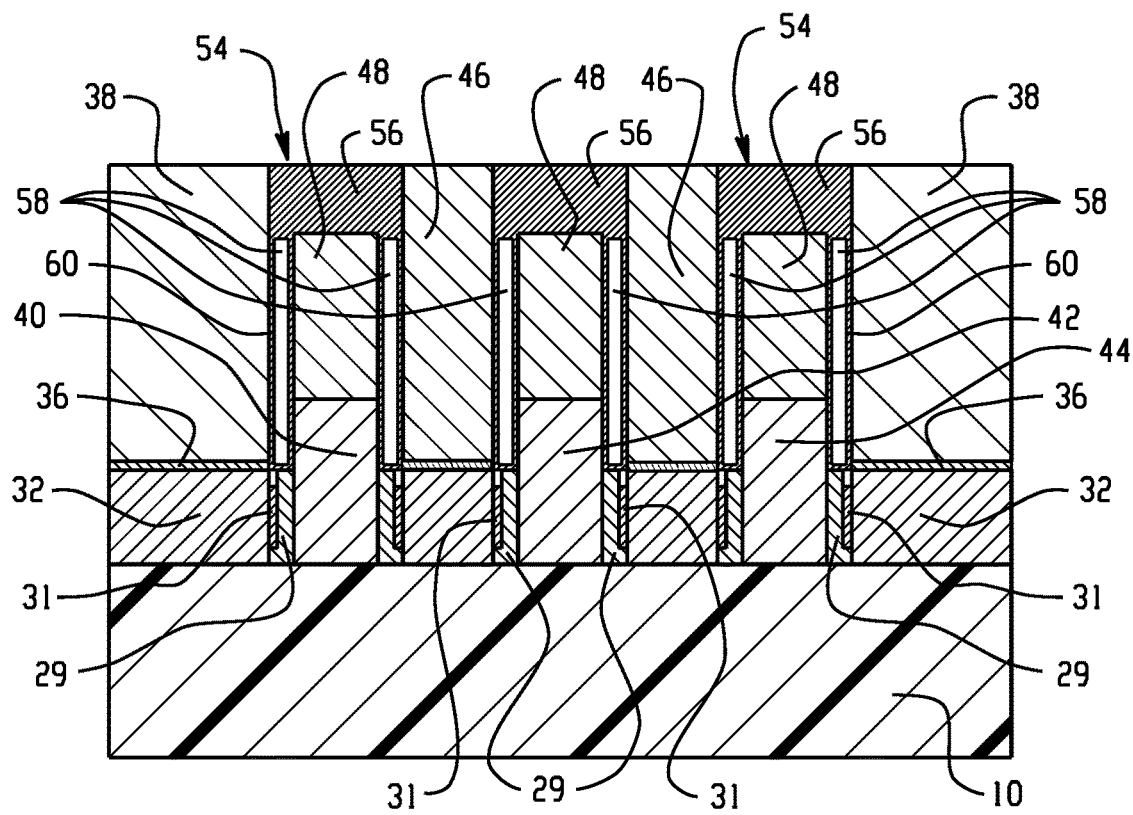

With reference to FIG. 11 in which like reference numerals refer to like features in FIG. 10 and at a subsequent fabrication stage, a dielectric layer 54 is deposited that fills the space vacated by the caps 50 with caps 56. The caps 56 cover and seal air-gap spacers 58 that are defined in the space vacated by the removed sidewall spacers 34. The air-gap spacers 58 may be characterized by an effective permittivity or dielectric constant of near unity (vacuum permittivity), or may be filled by air at or near atmospheric pressure, may be filled by another gas at or near atmospheric pressure, or may contain air or another gas at a sub-atmospheric pressure (e.g., a partial vacuum). Due to dimensional differences, the upper openings to the spaces vacated by the removed sidewall spacers 34 are closed before the spaces containing the air-gap spacers 58 can be filled by the dielectric layer 54. However, before the openings close, portions 60 of the dielectric layer 54 deposit on the surfaces of the interlayer dielectric layer 38, the gate electrodes 40, 42, 44, the contacts 46, 48, and the dielectric spacers 29, 31 as a liner that surrounds the air-gap spacers 58.

The air-gap spacers 58 are located horizontally between the contacts 46 and the vertical sidewalls 41 of the gate electrodes 40, 42, 44. The presence of the spacers 29 provides a predetermined depth over which the sidewall spacers 34 are removed and provides control over the location for the lower boundary of the air-gap spacers 58 relative to the gate electrodes 40, 42, 44. The air-gap spacers 58 are coextensive at their bottom ends with a top surface of the dielectric spacers 29, which is co-planar with the top surface 33 of the semiconductor layer 32. Sections of the air-gap spacers 58 are located vertically between the top surface 33 of the semiconductor layer 32 and the respective top surfaces 43 of the gate electrodes 40, 42, 44.

The device structure in the representative embodiment of FIG. 11 is a fin-type field-effect transistor (FinFET) in that the channel region of the transistor is located inside the semiconductor body defined by the fin 10. In an alternative embodiment, the embodiments of the invention may be applied to form the air-gap spacers 58 in a device construction that is a planar field-effect transistor instead of a fin-type field-effect transistor. The process flow in these alternative embodiments proceeds as depicted generally in FIGS. 2-11, except that the fin 10 is absent and the illustrated fabrication stages occur on the top surface of the substrate 12, instead of occurring on the top surface of the fin 10. Source/drain regions may be formed in and/or on the substrate 12 adjacent to the sacrificial gate structures 16, 18, 20 and eventually adjacent to gate electrodes 40, 42, 44. The portion of the substrate 12 used to form the field-effect transistor will represent a semiconductor body that is isolated by, for example, trench isolation regions similar to trench isolation 14. In an alternative embodiment, the gate structures 16, 18, 20 may not be sacrificial such that the process flow does not include the replacement of the gate structures 16, 18, 20 with the gate electrodes 40, 42, 44.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor fin having a top surface;
a gate electrode on the top surface of the semiconductor fin, the gate electrode having a sidewall;
a semiconductor layer on the top surface of the semiconductor fin, the semiconductor layer having a top surface;
a first dielectric spacer between the semiconductor layer and the sidewall of the gate electrode, and the first dielectric spacer extending continuously from the top surface of the semiconductor fin to the top surface of the semiconductor layer;
a contact connected with the top surface of the semiconductor layer; and
an air-gap spacer located in a horizontal direction between the contact and the sidewall of the gate electrode,
wherein the air-gap spacer extends in a vertical direction to the top surface of the semiconductor layer, and the air-gap spacer is located over the top surface of the first dielectric spacer.

2. The structure of claim 1 wherein the first dielectric spacer includes a top surface that is co-planar with the top surface of the semiconductor layer, and further comprising:
a second dielectric spacer between the semiconductor layer and the first dielectric spacer,
wherein the second dielectric spacer is located on the top surface of the semiconductor fin, and the second dielectric spacer is located vertically below the top surface of the semiconductor layer and the top surface of the first dielectric spacer.

3. The structure of claim 2 wherein the first dielectric spacer is located in the horizontal direction between the second dielectric spacer and the sidewall of the gate electrode.

4. The structure of claim 3 wherein the first dielectric spacer is comprised of silicon dioxide, and the second dielectric spacer is comprised of silicon nitride.

5. The structure of claim 1 wherein the semiconductor layer is part of a source/drain region of the semiconductor fin.

6. The structure of claim 1 further comprising:
a dielectric cap arranged over the air-gap spacer,
wherein the air-gap spacer is arranged in the vertical direction between the first dielectric spacer and the dielectric cap.

7. The structure of claim 6 further comprising:
a liner arranged to surround the air-gap spacer,
wherein the liner and the dielectric cap are comprised of a dielectric material.

8. The structure of claim 1 wherein the air-gap spacer has an effective permittivity of approximately unity.

9. The structure of claim 1 wherein the gate electrode has a top surface, and the air-gap spacer is arranged at and below the top surface of the gate electrode.

10. The structure of claim 1 further comprising:
an interlayer dielectric layer having a section,
wherein the air-gap spacer is arranged in the horizontal direction between the section of the interlayer dielectric layer and the gate electrode.

11. The structure of claim 10 wherein the first dielectric spacer and the interlayer dielectric layer are comprised of silicon dioxide.

12. The structure of claim 1 wherein the gate electrode includes one or more work function metal layers.

13. The structure of claim 12 wherein the contact is comprised of tungsten.

14. The structure of claim 12 wherein the first dielectric spacer is comprised of silicon dioxide.

15. The structure of claim 6 wherein the first dielectric spacer includes a top surface that is co-planar with the top surface of the semiconductor layer.

16. A structure comprising:
a semiconductor body having a top surface;
a gate electrode on the top surface of the semiconductor body, the gate electrode having a sidewall;
a semiconductor layer on the top surface of the semiconductor body, the semiconductor layer having a top surface;
a first dielectric spacer between the semiconductor layer and the sidewall of the gate electrode, the first dielectric spacer extending from the top surface of the semiconductor body to the top surface of the semiconductor layer;
a second dielectric spacer between the semiconductor layer and the first dielectric spacer;
a contact connected with the top surface of the semiconductor layer; and
an air-gap spacer located in a horizontal direction between the contact and the sidewall of the gate electrode,
wherein the air-gap spacer extends in a vertical direction to the top surface of the semiconductor layer, the second dielectric spacer is located on the top surface of the semiconductor body, the second dielectric spacer is located vertically below the top surface of the semiconductor layer, the first dielectric spacer has a thickness, and the second dielectric spacer has a thickness that is less than the thickness of the first dielectric spacer.

17. The structure of claim 16 wherein the first dielectric spacer is located in the horizontal direction between the second dielectric spacer and the sidewall of the gate electrode.

18. The structure of claim 17 wherein the first dielectric spacer is comprised of silicon dioxide, and the second dielectric spacer is comprised of silicon nitride.

19. The structure of claim 16 wherein the semiconductor layer is part of a source/drain region of the semiconductor body.

20. The structure of claim 16 wherein the gate electrode has a top surface, and the air-gap spacer is arranged at and below the top surface of the gate electrode.

* * * * *